United States Patent
Khoini-Poorfard et al.

[11] Patent Number: 6,121,827
[45] Date of Patent: Sep. 19, 2000

[54] DIGITAL NOISE REDUCTION IN INTEGRATED CIRCUITS AND CIRCUIT ASSEMBLIES

[75] Inventors: Ramin Khoini-Poorfard, Allentown; Lysander B. Lim, Emmaus, both of Pa.

[73] Assignee: Lucent Technologies, Inc., Murray Hill, N.J.

[21] Appl. No.: 09/293,510

[22] Filed: Apr. 15, 1999

[51] Int. Cl.[7] .................................................. H01L 25/00
[52] U.S. Cl. ............................ 327/565; 364/491; 326/47
[58] Field of Search ................................ 327/564, 565; 326/47; 364/488, 489, 490, 491

[56] References Cited

U.S. PATENT DOCUMENTS

| | | | |
|---|---|---|---|
| 5,453,713 | 9/1995 | Partovi et al. | 327/565 |
| 5,621,347 | 4/1997 | Saito et al. | 327/565 |
| 5,900,763 | 5/1999 | Rahim et al. | 327/565 |
| 6,031,406 | 2/2000 | Drost et al. | 327/565 |

*Primary Examiner*—Timothy P. Callahan
*Assistant Examiner*—An T. Luu
*Attorney, Agent, or Firm*—Synnestvedt & Lechner LLP

[57] ABSTRACT

A mixed signal integrated circuit board having decreased sensitivity of analog circuitry to digital circuitry noise is disclosed. In the mixed-signal integrated board of the present invention, a new (second) analog ground is created. This new analog ground is not limited by the manufacturing specification of connectivity to the substrate of the circuit board and is thereby free of transient noise generated by digital components on the board. In a mixed-signal integrated circuit board of the present invention, the new analog ground becomes the preferred ground and is utilized in many sensitive analog applications including voltage and current measurements. The new analog ground is easy to create as it does not involved complicated circuitry. The new analog ground may be created even after the initial circuit schematics has been created.

12 Claims, 3 Drawing Sheets

DIGITAL NOISE REDUCTION IN INTEGRATED CIRCUITS AND CIRCUIT ASSEMBLIES

FIELD OF THE INVENTION

The present invention relates to noise reduction in integrated circuits and circuit assemblies, particularly, the invention relates to digital noise reduction in the analog and digital mixed-signal subsystems and mixed-signal integrated circuit chips.

BACKGROUND OF THE INVENTION

Both analog and digital integrated circuits have been widely used in the electronics industry for many years. Until recently, however, integrated circuits were typically either digital or analog, but not both. Mixed-signal integration, in which analog and digital circuitry are integrated on the same chip, has only recently gained widespread use in response to the need to find new ways to continue the trend of increasing integration. Reducing the number of chips in a product simplifies manufacture, reduces cost and increases reliability.

Mixed-signal integration, however, presents considerable problems not present in either analog or digital integrated circuits. Notably, the noise spectrum produced by high-speed digital circuits can easily interfere with analog components. Since the waveforms transitions generated by digital circuits are, at least ideally, step transitions having (in accordance with Fourier analysis) a wide noise bandwidth, potential interference of the chip's digital signals with the chip's analog signals poses a distinct threat to circuit performance.

Generally, digital circuits switch quickly between pre-defined voltage levels (typically 0 volts and 3 or 5 volts), and consequently induce transient disturbances in signal and power lines, as well as energy radiated as electromagnetic waves. Digital circuits themselves are robust in the presence of noise from other sources. By contrast, analog circuits operate at a multiplicity of voltage levels and frequencies, and are sensitive to induced noise. Thus, ensuring that digital switching noise does not create interference with analog functions becomes a design challenge.

FIG. 1 illustrates a circuit example of how an analog circuit may be sensitive to the noise generated by digital circuits. In FIG. 1, integrated circuit board 10 comprises a chip 12 mounted on a package 14. The chip 12 comprises a variety of components mounted on a substrate (not shown).

The chip 12 comprises an analog circuitry 18 having an analog ground 24. The chip 12 also comprises digital circuitry (current source 20) having a digital ground 26. The analog ground 24 and digital ground 26 are coupled together (indirectly or directly) via a substrate connection 22. In some instances, the substrate connection 22 is an actual wired connection. In other instances, even though a direct connection may not exist between analog ground 24 and digital ground 26, an indirect connection 22 exists because the substrate of chip 12 itself is not perfectly insulated and acts like a connecting medium for the analog ground 24 and the digital ground 26. According to typical mixed-signal manufacturing specifications, the analog ground 24 and the digital ground 26 must be physically connected to the substrate located in the chip 12 to facilitate the functionality of the chip 12. Thus, an indirect substrate connection 22 is created via the substrate of the chip 12.

The analog ground 24 is connected to a paddle 30 located on package 14. The paddle 30 is located off of the chip 12 and is directly connected to a pad 28 located on the chip 12. In a typical case, the pad 28 is embedded in the chip 12 and the paddle 30 acts as an access point for the pad 28 and other nodes embedded in chip 12. The paddle 30 is connected to the pad 28 via a bonded wire connection 32. The pad 28 is directly connected to the analog ground 24.

The integrated circuit board 10 also has another ground node known as a board ground 34. In a typical case, the board ground 34 is created by connecting it to the ground terminal of a power source (e.g., a battery, not shown). The paddle 30 is directly connected to the board ground 34 via a bonded-wire connection 36.

The digital circuitry 20 creates digital noise as it switches between the predefined voltage levels. This digital noise comprises transient currents in the digital section of the chip 12, thereby making the digital ground 26 noisy as well. This digital noise is passed to the analog ground 24 via the substrate connection 22.

The analog ground 24 is directly connected to the pad 28. The transient currents are passed from the analog ground 24 to the pad 28. The pad 28 is directly connected to the paddle 30, thus, transient currents are passed from the pad 28 to paddle 30, thereby making paddle 30 noisy.

The board ground 34 is comparatively larger in size and is located outside the package 14 and is relatively unaffected by this digital noise. The board ground 34 is usually connected to a ground terminal of a power supply source thus, not as susceptible to the transient currents as pad 28. On the contrary the pad 28, which is located on the chip 12, is relatively noisy and affects the voltage levels and frequencies of analog circuitry 18. The pad 28 (which is an interface point to the analog ground 24) is commonly used in many analog functions (e.g., to measure voltage levels and frequencies). The noise on the pad 28 affects the correct measurement of the voltage levels and frequencies in analog circuitry 18.

One measure used in the prior art to reduce such noise interference is to group analog components (commonly termed I/O cells) together and to place analog circuitry having critical performance requirements in the vicinity of the analog I/O cells. This solution attempts to, in effect, separate the analog and digital portions of the chip to reduce the proximity of certain analog components to digital components and hence the susceptibility of the analog components to noise from the digital components.

In many systems, digital circuits switch rapidly, but regularly, with edges synchronous to a master clock and, therefore, generate noise with a strong spectral component at the clock frequency. Additionally, harmonics at odd multiple of the clock frequency are generated. If the circuit remains synchronous to a master clock, but switches on random clock edges, spectral components above and below the clock frequency also are generated. In these systems, it is possible to render the analog circuitry less sensitive to noise at the clock frequency by arranging for the analog circuits to operate on a clocked basis. Specifically, benefits are obtained if the analog circuits are clocked out of phase with the digital circuits. Alternately, the digital clock frequency may be chosen to be substantially above or below the frequency band in which the analog circuits operate.

The foregoing techniques are often not fully effective, since the digital noise can extend well above and below the clock frequency. In such situations, it is then necessary to resort to costly shielding techniques. In fact, integration of the analog and digital circuits may become infeasible, requiring that they be partitioned into separate chips, with the attendant increased cost overhead in packaging and connectors. Therefore, there remains a need for further measures to effectively reduce the digital noise in mixed-signal integrated circuits.

SUMMARY OF THE INVENTION

A mixed signal integrated circuit having decreased sensitivity of analog circuitry to digital circuitry noise is disclosed.

In the mixed-signal chip (located on the integrated circuit) of the present invention, a new (second) analog ground is created. This new analog ground is not limited by the manufacturing specification of connectivity to the substrate and is thereby free of transient noise generated by digital components on the board.

Typically, in a mixed-signal integrated circuit that includes an analog circuit and a digital circuit, the old analog ground is connected to a pad located on the chip and to a paddle located on the package housing the chip. Both the pad and the paddle are susceptible to digital noise. However, the paddle is connected to a board ground, wherein the board ground is relatively free of transient noises. In accordance with the invention, a second pad is created on the chip. The new analog ground is created by connecting the newly created pad to the existing paddle located in the package.

DETAILED DESCRIPTION OF THE PREFERRED EMBODIMENT

Figure 1:
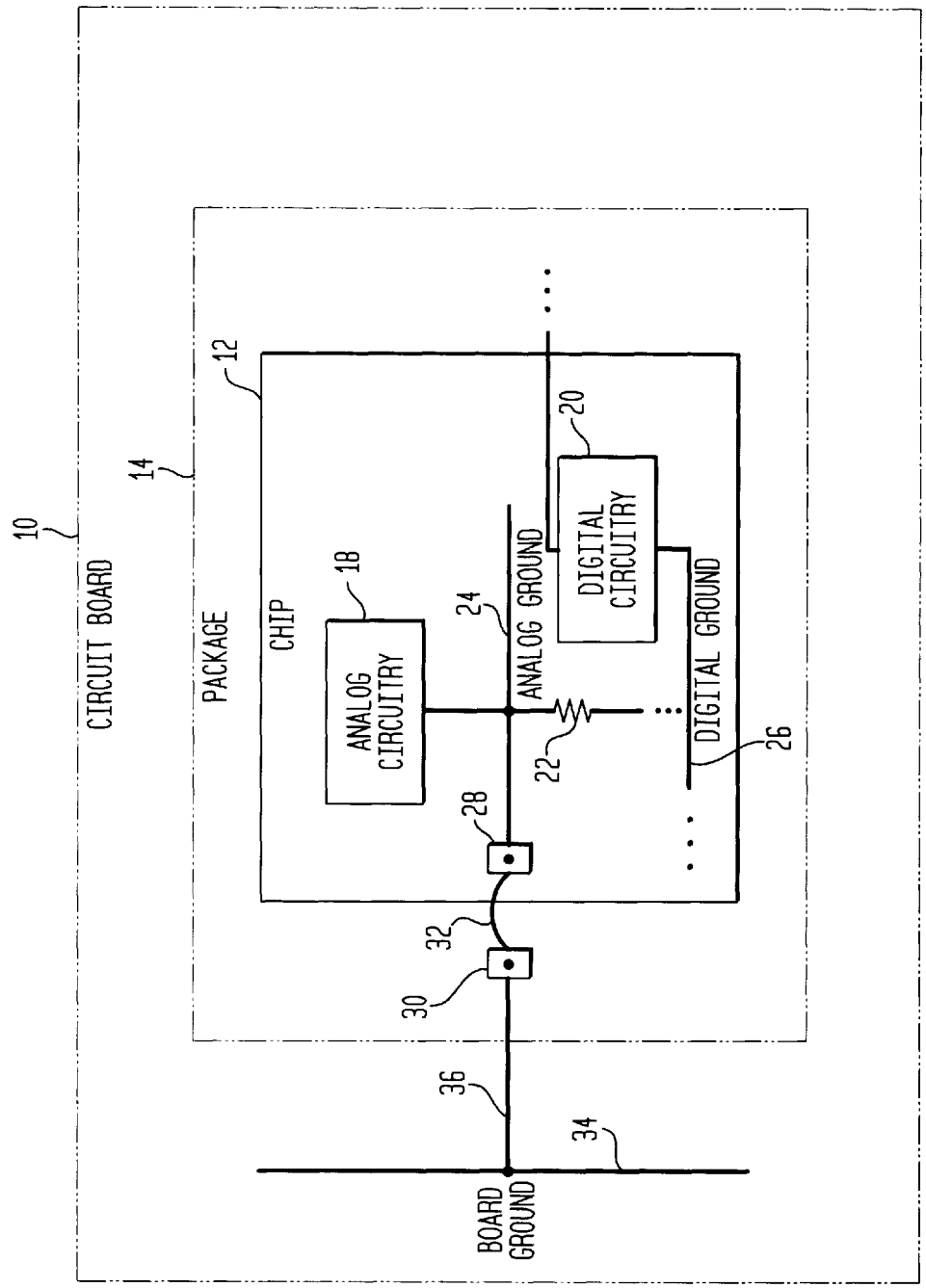
FIG. 1 is a block diagram of a prior art mixed-signal integrated circuit board.
Figure 2:
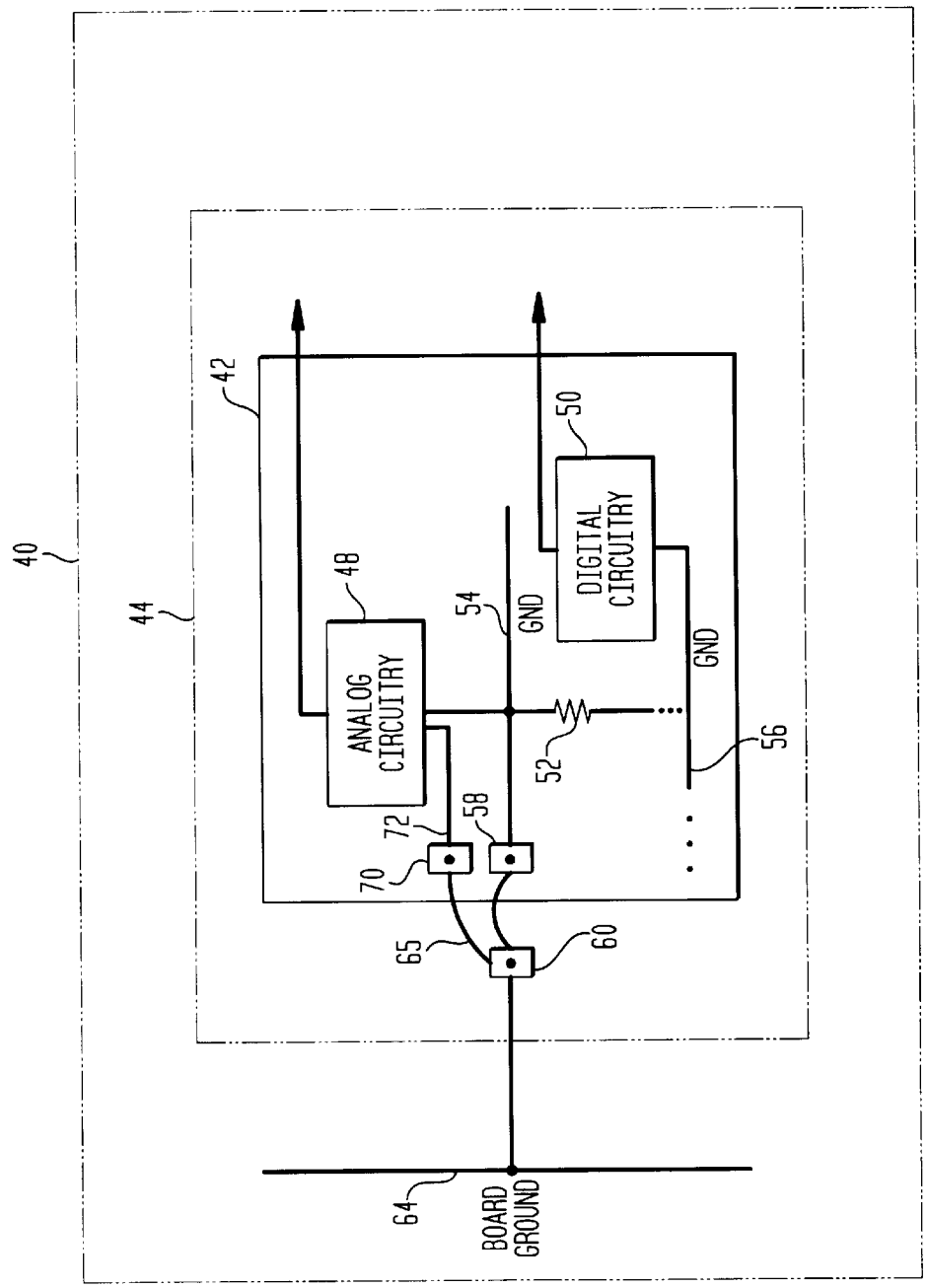
FIG. 2 illustrates a mixed-signal integrated circuit board according to the principles of the present invention.

FIG. 2 illustrates a block diagram of the preferred embodiment of the present invention. In FIG. 2, a mixed-signal chip 42 is located in a package 44. The chip 42 comprises a variety of components mounted on a substrate (not shown). The package 44 is mounted on an integrated circuit board 40.

Within the chip 42, there exists analog circuitry 48 and digital circuitry 50. The digital circuitry 50 is capable of modeling a digital current source and has a digital ground 56. The analog circuitry 48 is capable of operating at different voltages and frequencies and has an analog ground 54. Both analog ground 54 and the digital ground 56 are physically coupled to the substrate of the chip 42. The analog ground 54 is directly connected to a pad 58. The pad 58 is located on the chip 42 and acts as an interface point to the analog ground 54.

The pad 58 is directly connected to a paddle 60 via a bonded wire connection 62. The paddle 60 is located on the package 44, but outside the boundary parameter of chip 42. The paddle 60 acts as a connecting point to the nodes embedded in the chip 42 and is easily accessible by an external device (e.g., automated test equipment).

Unlike the analog circuitry 48, the digital circuitry 50 does not usually operate at more than two voltage levels. The digital circuitry 50 switches rapidly between the predefined voltage levels and frequencies (usually only 0 and 1). Consequently, it induces transient disturbance, also known as digital noise and this digital noise is directly communicated to the digital ground 56. Thus, the digital ground 56 is full of transient disturbances (noisy).

The transient disturbances are communicated from the digital ground 56 to the analog ground 54 and the pad 58 via a substrate connection 52. As explained above, in some instances, the substrate connection 52 may be an actual wired connection. In other instances, it may be a indirect connection connecting the analog ground 54 and the digital ground 56 by the fact that they are located on the same chip 42 and physically connected to the substrate of the chip 42. The analog ground 54 and the digital ground 56 must be physically connected to the substrate to create necessary tub-ties required for the functionality of the chip 42. The substrate of the chip 42 is not perfectly insulated and acts like a connecting medium for the analog ground 54 and the digital ground 56.

The pad 58 is affected by the digital transient disturbances. However, the board ground 64 is relatively free of any transient disturbances. As explained, the board ground 64 is located on the integrated circuit board 40, but is outside the parameters of package 44, thus transient disturbances are not easily communicated to this board ground 64. Generally, the board ground 64 is created by connecting it to the ground terminal of a power source (e.g., a battery) (not shown).

Most digital circuits are robust and are not significantly affected by digital noise. On the contrary, analog circuitry 48 generally is much more sensitive in nature and comprises a plurality of sensitive nodes (not shown) which are greatly affected in their operating voltages and frequencies due to the digital noise.

To resolve this problem, in the present invention, a second analog ground 72 is introduced. The second analog ground 72 is not directly connected to the substrate of the chip 42, although parasitic couplings may exist to the substrate of the chip 42. The second analog ground 72 is relatively free of the transient noise because it is not used to create the tub-ties. The second analog ground 72 is connected to the sensitive nodes (sensitive reference nodes) in the analog circuitry 48 and has its own pad 70. The pad 70 is located on the chip 42 and is connected to the paddle 60 by another bonded wire connection 65.

Since there is no direct communicative connection existing between the second analog ground 72 and the substrate, little or no digital noise is communicated from the digital ground 56 to the analog ground 72. According to typical mixed-signal manufacturing specifications, the analog ground 72 and the digital ground 56 must be physically connected to the substrate in the chip 42 to facilitate the functionality of the mixed-signal chip 42.

No or little noise is generated on the paddle 60 from the board ground 64 because the board ground 64 is connected to a clean power source and is located outside the boundary of package 44. This frees the bonded wire connection 65 of digital nose, thereby leaving the second analog ground 72 free of any transient disturbances.

The second analog ground 72 acts as a preferred analog ground for all applications related to analog circuitry 48. One example of such application is a measurement of the bandgap voltage. The second analog ground 72 may be used as a reference node to achieve the bandgap voltage which is free of transient disturbances.

The second analog ground 72 is easy to create as it requires no complicated circuitry. An existing paddle 60 is used and the only requirement is a new pad 70. The new pad 70 can be created at any time, even after initial circuit schematic layout has been created. Thus, the present invention can be practiced with very low cost.

Figure 3:
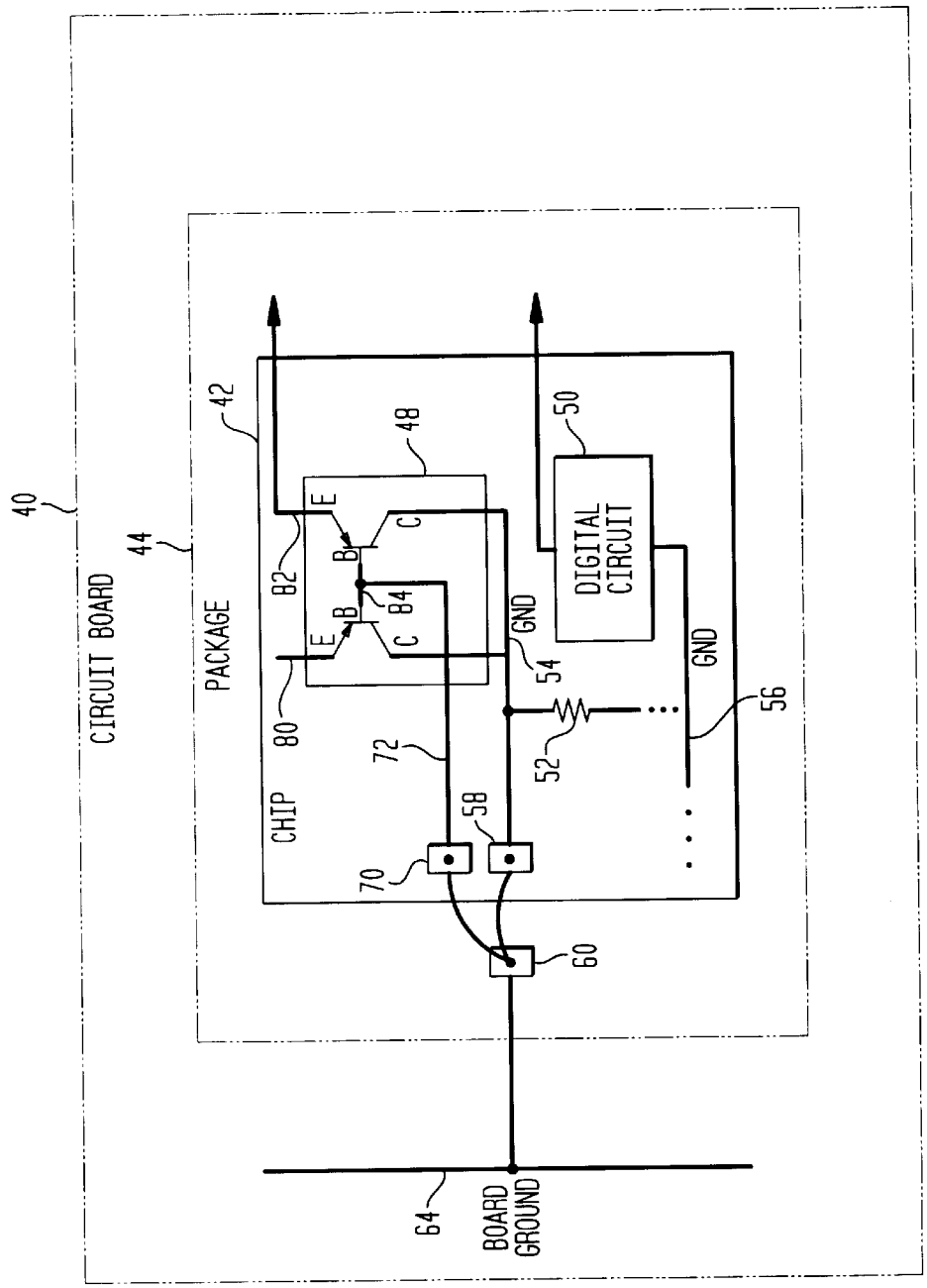
FIG. 3 illustrates another mixed signal integrated circuit board according to the principles of the present invention.

FIG. 3 illustrates use of the present invention in a particular analog circuit (analog circuitry comprising two pnp transistors). In FIG. 3, there exists two pnp transistors 80 and 82, which together create an analog circuit 48. This is a typical configuration of a current mirror circuit. The base terminals (shown as B) of both pnp transistors 80 and 82 are interconnected by a link 84. The first analog ground 54 is created by traditional means wherein collector terminals (shown as C) of both pnp transistors 80 and 82 are interconnected. This interconnection is further connected to pad 58, thereby creating a first analog ground 54. The pad 58 is connected to a paddle 60 by a bonded wire connection 62.

The analog ground 54 is noisy as there is a direct or an indirect communicative link 52 connecting the digital ground 56 and the analog ground 54. The second analog ground 72 (preferred analog ground) is created by creating a new pad 70 and joining the pad 70 directly to the link 84 (link connecting base terminals of both pnp circuits). The pad 70 is further connected to the paddle 60 by a second bonded wire connection 65.

The second analog ground 72 is the desired analog ground because it is relatively free of the digital noise and it is connected to the reference terminals (base terminals) of the pnp transistors 80 and 82. The second analog ground 72 may be utilized in many sensitive analog applications including voltage and current measurements. The second analog ground 72 is easy to create as it does not involved complicated circuitry. The second analog ground 72 may be created even after the initial circuit schematics has been created.

The above is only one particular example of the present invention. In this example, the problem of digital noise is resolved for an analog circuitry comprising two pnp transistors.

While the present invention is described in the context of a mixed-signal chip, the more general techniques of the present invention, however, may be applied to mixed-signals circuits of all types, including mixed-signal chips and mixed-signal circuit boards, as well as other instances in which digital noise is to be reduced.

The present invention is most applicable to low-frequency mixed signal chips, because in low-frequency mixed signal chips, it is easier to isolate the second analog ground created according to the principles of the present invention from any transient disturbances. This may not be the case for high-frequency mixed signal chip. In high-frequency mixed signal chips, the air acts as a transmission medium and may create an undesired indirect communicative link between the second analog ground and the substrate. This indirect communicative link is capable of communicating digital noise from the digital ground to the second analog ground.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

It will be appreciated by those skilled in the art that the invention can be embodied in other specific forms without departing from the spirit or essential character thereof.

What is claimed is:

1. A method of reducing digital noise in a mixed-signal circuit that includes an analog circuit and a digital circuit, said analog circuit having a first analog ground, said digital circuit having a digital ground, said first analog ground having a first pad connected to a paddle by a bonded wire connection, said first analog ground and said digital ground connected, said method comprising:

creating a second pad;

connecting said second pad and said paddle by a second bonded wire connection; and creating a second analog ground by connecting said second pad to said sensitive nodes located in said analog circuit.

2. A method of reducing digital noise in a mixed-signal circuit that includes an analog circuit and a digital circuit, said analog circuit having two pnp transistors, collector terminals of said pnp transistors interconnected by a first interconnection and creating a first analog ground, base terminals of said pnp transistors interconnected by a second interconnection, said digital circuit having a digital ground, said analog ground and said digital ground connected, said analog ground having a first pad, said first pad connected to said interconnection between said collector terminals, said first pad connected to a paddle by bonded wire connection, said method comprising:

creating a second pad;

connecting said second pad and said paddle by a second bonded wire connection; and creating a second analog ground connecting said second pad to said second interconnection existing between said base terminals of said pnp transistors.

3. An integrated circuit that includes an analog circuit and a digital circuit, said integrated circuit comprising:

a digital ground connected to said digital circuit;

a first analog ground connected directly to said analog circuit and connected to said digital ground; and a second analog ground connected to said analog circuit.

4. The integrated circuit of claim 3, wherein said first analog ground comprises a first pad connected to a paddle by a first bonded wire connection, said second analog ground comprises a second pad connected to said paddle by a second bonded wire connection.

5. An integrated circuit for reducing digital noise in a mixed-signal circuit that includes an analog circuit and a digital circuit, said analog component comprising two pnp transistors interconnected, said apparatus comprising:

a digital ground connected to said digital circuit;

a first analog ground connected directly to said analog circuit and connected directly or indirectly to said digital ground; and a second analog ground connected to said analog circuit.

6. The integrated circuit of claim 5, wherein said first analog ground comprises a first pad connected to collector terminals of said pnp transistors, said second analog ground comprises a second pad connected to base terminals of said pnp transistors.

7. The integrated circuit of claim 6, wherein said first pad and said second pad both connected to a paddle.

8. A circuit board comprising:

a package housing a mixed-signal integrated chip comprising an analog circuit and a digital circuit formed on a substrate, said package mounted on said circuit board;

a substrate located in said mixed-signal chip;

a first analog ground, said first analog ground connected to said analog circuit and to said substrate;

a digital ground, said digital ground connected to said digital circuit and said substrate;

a board ground located on said circuit board, said board ground located outside said package; and a second analog ground located on said integrated chip, said second analog ground connected only to said analog circuit.

9. The circuit board of claim 8, wherein said first analog ground comprises a first pad and a paddle.

10. The circuit board of claim 9, wherein said first pad and said paddle are connected by a bonded-wire connection.

11. The circuit board of claim 9, wherein said second analog ground comprises a second pad and said paddle.

12. The circuit board of claim 11, wherein said second pad said paddle are connected by a second bonded wire connection.

* * * * *